United States Patent [19]
Fukasawa

[11] Patent Number: 5,805,472
[45] Date of Patent: Sep. 8, 1998

[54] TEST HANDLER FOR SEMICONDUCTOR DEVICES

[75] Inventor: Yoshihito Fukasawa, Kanagawa-ken, Japan

[73] Assignee: Kabushiki Kaisha Toshiba, Kawasaki, Japan

[21] Appl. No.: 804,917

[22] Filed: Feb. 24, 1997

[30] Foreign Application Priority Data

Feb. 27, 1996 [JP] Japan .................................. 8-040017

[51] Int. Cl.$^6$ .............................. G06F 7/10; G01R 31/28
[52] U.S. Cl. ............... 364/579; 364/468.22; 364/468.23; 364/468.28; 324/754; 324/755; 414/222; 414/287
[58] Field of Search ............................. 364/579, 468.22, 364/468.23, 468.28; 324/158.1, 755, 754, 760, 765, 73.1; 209/509, 552, 571, 573, 651; 438/15, 17; 414/222, 287, 331, 416

[56] References Cited

U.S. PATENT DOCUMENTS

| | | | |
|---|---|---|---|
| 4,869,636 | 9/1989 | Reid et al. | 414/222 |
| 5,148,100 | 9/1992 | Sekiba | 324/158 |
| 5,184,068 | 2/1993 | Twigg et al. | 324/755 |
| 5,227,717 | 7/1993 | Tsurishima et al. | 324/158 |
| 5,290,134 | 3/1994 | Baba | 414/404 |
| 5,307,011 | 4/1994 | Tani | 324/158 |
| 5,313,156 | 5/1994 | Klug et al. | 324/158.1 |
| 5,347,463 | 9/1994 | Nakamura et al. | 364/468.23 |
| 5,625,287 | 4/1997 | Nakamura et al. | 324/158.1 |
| 5,635,832 | 6/1997 | Ito et al. | 324/158.1 |
| 5,652,523 | 7/1997 | Noguchi | 324/755 |
| 5,654,204 | 8/1997 | Anderson | 438/15 |

Primary Examiner—James P. Trammell
Assistant Examiner—Bryan Bui
Attorney, Agent, or Firm—Foley & Lardner

[57] ABSTRACT

In a test handler for semiconductor devices according to the invention, test trays are provided with respective identification codes specific to them and the identification codes of the test trays are read by a reading device arranged respectively at given control sites in the test handler and stored in a control table and controlled by a control device along with data on the control sites for reading the identification codes of test trays and the product ICs loaded on the test trays carrying the detected identification codes. Additionally, the contents of the control table are displayed on a monitor screen and the data on the individual test trays obtained at the individual control sites and those on the product ICs are centrally controlled.

6 Claims, 12 Drawing Sheets

FIG. 8

| CURRENT LOCATION | P NUMBER | TEST TRAY IDENTIFICATION CODE | NAME OF PRODUCT IC | LOT NUMBER OF PRODUCT IC | NUMBER OF REGISTERED PRODUCT ICs |
|---|---|---|---|---|---|
| | | | | | |

FIG. 11

| CURRENT LOCATION (CONTROL SITE) | P NUMBER | TEST TRAY IDENTIFICATION CODE | NAME OF PRODUCT IC | LOT NUMBER OF PRODUCT IC | NUMBER OF LOADED PRODUCT ICs |
|---|---|---|---|---|---|
| 1 | P-8 | TSOP50400-18 | XXYY | C(6) | 30 |
| 2 | | | | | |
| 3 | | | | | |
| 4 | | TSOP50400-17 | XXYY | C(5) | 32 |
| 5 | | | | | |
| 6 | | | | | |
| 7 | | TSOP50400-16 | XXYY | C(4) | 32 |
| 8 | | TSOP50400-15 | XXYY | C(3) | 32 |
| 9 | | TSOP50400-14 | XXYY | C(2) | 32 |
| 10 | | TSOP50400-13 | XXYY | C(1) | 15 |
| 11 | | TSOP50400-12 | XXYY | B(F) | 32 |
| 12 | | TSOP50400-11 | XXYY | B(E) | 32 |
| 13 | | TSOP50400-10 | XXYY | B(D) | 32 |
| 14 | P-3 | TSOP50400-09 | XXYY | B(B) | 32 |
| 15 | | TSOP50400-08 | XXYY | B(C) | 32 |
| 16 | P-5 | TSOP50400-07 | XXYY | B(A) | 32 |
| 17 | | | | | |
| 18 | | | | | |
| 19 | | | | | |
| 20 | | | | | |
| 21 | | | | | |
| 22 | | | | | |
| 23 | P-6 | TSOP50400-06 | XXYY | A(6) | 25 |
| 24 | P-7 | TSOP50400-05 | XXYY | A(5) | 32 |
| 25 | | | | | |

TEST HANDLER FOR SEMICONDUCTOR DEVICES

BACKGROUND OF THE INVENTION

1. Field of the Invention

This invention relates to a test handler for semiconductor devices adapted to moving a plurality of transport boards (hereinafter referred to as test trays) carrying a plurality of product ICs within the handler and testing the product ICs.

2. Prior Art

An increasingly prolonged time is required for testing a memory product as a result of the enhanced degree of integration achieved in recent years for memories. On the other hand, new testing techniques have been developed to cope with this situation and currently as many as 64 memories can be tested simultaneously. Test trays have been used for moving product ICs within test handlers that are adapted to test memories.

FIGS. 1 through 3 of the accompanying drawings schematically illustrate a known test handler of the type under consideration that uses test trays.

FIG. 1 schematically shows the configuration of a test tray.

Referring to FIG. 1, the test tray 1 may have dimensions of width, length and height of 400 mm×260 mm×28 mm and carry up to 32 product ICs 2 put in respective carriers 3.

FIG. 2 is a schematic perspective view of a known test handler for testing product ICs that are carried by test trays 1 and FIG. 3 schematically shows the configuration of a product tray that is used in a loader section and also in an unloader section of the test handler.

Referring to FIG. 2, a test tray cassette 4 is arranged in the test handler and contains a plurality of vacant test trays 1 carrying no product IC as shown in FIG. 1. The test handler comprises a loader/elevator (not shown) for lifting test trays 1 contained in a test tray cassette 4, a loader section 6 for storing product trays 5 carrying untested product ICs 2, a preheater (precooler) chamber 7 for maintaining the product ICs 2 carried by test trays 1 to a predetermined temperature level, a main chamber 8 for measuring certain electric characteristics of the product ICs held to the predetermined temperature by the preheater (precooler) chamber 7, a defroster (cooling) chamber 9 for cooling the product ICs 2 tested by the main chamber 8 to ambient temperature and an unloader section 10 for taking out the tested product ICs from test trays 1 and sorting them into graded groups according to their ratings.

Referring to FIG. 3, the product tray 5 may have dimensions of width, length and height of 330 mm×122 mm×7.5 mm and contain up to 60 product ICs in its pockets 11.

Now, the test procedure using a test handler as shown in FIG. 2 will be described.

Firstly, product trays 5 carrying a lot of product ICs to be tested are contained in the loader section 6 while product trays 5 carrying tested and sorted product ICs are placed in the unloader section 10 and, in the phase of starting an operation of placing product ICs to be tested on vacant test trays 1, a test tray cassette 4 carrying test trays 1 is placed in position in the test handler. Test trays 1 are drawn out of the test tray cassette 4 (along arrow A) and lifted upward by the loader/elevator (along arrows B and C) before put into the preheater (precooler) chamber 7 (along arrows D and E) and made to sink in the chamber 7 (along arrows F and G), where they are heated or cooled if necessary. The heated or cooled test trays 1 are moved through the main chamber 8 (along arrows H, I and J) and then into the defroster (cooling) chamber 9 to position P-6 (along arrows K, L and M). The first test tray 1 moved to position P-6 is further moved to position P-7 and then to position P-8 (along arrows N and P), where the product ICs to be tested are taken out from the uppermost product tray 5 in the loader section 6 and moved onto the first vacant test tray 1 now placed at position P-8 (along arrow Q).

Then, in the normal testing cycle, test trays 1 carrying product ICs in position are brought into the preheater (precooler) chamber 7 (along arrows, R, C, D, E, F and G) for preheating or precooling, whichever appropriate, and moved further to position P-3 and then to position P-5 (along arrows H, I and J) in the main chamber 8 of the test handler so that two test trays 1 are connected to a measuring section of the test handler and tested for given electric characteristics simultaneously. After completing the test, the test trays 1 are moved to the defroster (cooling) chamber 9 (along arrows K and L) and cooled to room temperature. The test trays 1 cooled to room temperature are moved to position P-7 (along arrows M and N), where the tested product ICs are taking out from test trays 1 and sorted into graded groups according to their ratings (along arrow 0). The test trays 1 that are freed from product ICs and vacant now are moved from position P-7 to position P-8 (along arrow P and Q), where they receive new product ICs to be tested from the uppermost product trays 5 stored in the loader section 6.

The above normal testing cycle is repeated until all the product ICs carried by the product trays 5 stored in the loader section 6, when the tested product ICs are sorted out onto product trays stored in the unloader section 10 to complete the operation of testing a lot of product ICs.

The above testing operation may be repeated to test a given number of lots of product ICs.

The test trays 1 have to be replaced for testing product ICs of a different type (package). If such is the case, all the test trays 1 in the test handler are put back into the test tray cassette 4 (along arrows R, B and A) by means of the loader/elevator used in the starting phase. The test tray cassette 4 containing the test trays 1 is then moved out of the test handler and another test tray cassette 4 containing different test trays 1 are placed in position in the test handler so that the above described testing procedure may be started.

For testing successively a plurality of different lots of product ICs with a test handler of the above described type, a chart of operation sequence as illustrated in FIG. 4 may be used.

The operation sequence of FIG. 4 is designed to test the product ICs of lot A and then the product ICs of lot B. The test handler starts loading product ICs onto test trays at time T1. Then, the test tray 1 are moved through the preheater (precooler) chamber 7 and eventually the first and third test trays 1 gets to respective positions P-5 and P-3 in the main chamber 8 at time T2, when the actual test starts on them.

After the completion of the test, the first test tray 1 is moved to position P-7 through the defroster (cooling) chamber 9 and the test handler starts sorting (unloading) product ICs at time T3. Normally, product ICs are loaded sequentially onto test trays 1 as far as product ICs to be tested are carried by product trays 5 in the loader section 6. The operation of loading all the product ICs of lot A onto test trays 1 is completed at time T4. The test on the product ICs on the last test tray 1 ends at time T5. The product trays 5 carrying sorted product ICs are moved out of the test handler to complete the operation of testing lot A.

Subsequently, the product ICs of lot B are tested between time T7 and time T12, using the same sequence.

Product ICs are loaded onto a test tray 1 by means of carriers 3 of the test tray 1 arranged in such a way that each of the carriers 3 carries a single product IC as shown in FIG. 1. Each of the carriers 3 has a configuration as schematically shown in FIGS. 5A and 5B. As the carrier 3 is pressed in the loader section 6 along the direction of arrow F shown in FIG. 5B, lead holders 12 of the carrier 3 are released to get ready for receiving a product IC 2. Then, as a product IC 2 is introduced into the carrier 3, the lead holders 12 are swung back to hold the product IC 2 under the urging effect of coil springs 13. The product IC 2 is taken out and moved onto a product tray 5 in the unloader section 10 as the lead holders 12 are released in a similar manner.

As seen from the operation sequence of FIG. 4, the test handler actually operates between time T1 and time T6 and between time T7 and time T12, whereas the testing equipment operates between time T2 and time T5 and between time T8 and time T11. A set of product trays 10 filled with tested product ICs 2 of lot A are moved out of the unloader section 10 to complete the operation of testing the lot A and another set of product trays 5 are introduced and placed in position for product ICs 2 of lot B during the period between time T6 and time T7.

With the above described operation sequence, the testing equipment is at rest between time T1 (T7) and time T2 (T8), while the handler is operating during that time period. Likewise, the testing equipment is at rest and no test is conducted on product ICs between time T5 (T11) and time T6 (T12).

The above described operation sequence has been devised with the intention of avoiding a situation where a plurality of lots of product ICs become involved in trouble by starting the operation of loading the product ICs of lot B after the test on the product ICs of lot A is completed and the products are completely moved out of the test handler. With this arrangement, if any trouble occurs in the test handler while it is handling the product ICs of lot A and there is no prospect of early recovery, the testing operation can be resumed for the product ICs of other lots by using another test handler to minimize the loss of time due to the trouble.

In any known test handler using test trays, a plurality of test trays are moving inside the test handler and are monitored by an operator but there is no way of accurately locating them within the test handler for the operator. Therefore, it is highly risky to handle different lots simultaneously in a single test handler.

Thus, the product ICs of a lot have to be completely removed from the test handler before those of another lot are moved into the test handler in order to avoid the risk of undiscriminable coexistence of product ICs of different lots in the test handler even when the latter is driven on a continuous operation basis. The net result is a long idle time on the part of the test handler and the testing equipment that occurs for the exchange of two successive lots and a poor operation efficiency.

SUMMARY OF THE INVENTION

In view of the above described circumstances, it is therefore the object of the present invention to provide a test handler for semiconductor devices that can reduce the idle time on the part of the testing equipment and improve the operation efficiency in a continuous operation mode.

According to the invention, the above object is achieved by providing a test handler for semiconductor devices operating with steps of loading a plurality of product ICs to be tested on test trays in a loading section, transferring the test trays with the product ICs to a testing section for testing the product ICs and moving the test trays with the tested product ICs to a sorting section for sorting the product ICs according to the test result, the test handler comprising: test trays provided with respective identification codes specific to them to make them discriminable from any other test trays; reading means arranged respectively at given control sites on the test tray transfer route in the test handler for reading the identification codes of the test trays passing there; and a control means including a control table for storing and controlling the identification codes read by said reading means along with data on the control sites for reading the identification codes of test trays and the product ICs loaded on the test trays carrying the detected identification codes and adapted to display the contents of said control table on a monitor screen and centrally control the data on the individual test trays obtained at the individual control sites and those on the product ICs.

With the above arrangement, product ICs of different lots can be tested continuously by the test handler to reduce the idle time of the testing equipment and enhance the operation efficiency of the test handler in a continuous operation mode.

Preferably, a reading means is arranged at the loading section of the test handler for reading the identification codes of the test trays located there to update the contents of said control table in synchronism with the operation of transferring said test trays.

With such an arrangement, the test trays in the test handler can be located with ease and the product ICs of a lot can be easily discriminated from those of another lot.

Preferably, the identification codes carried by the test trays in the test handler are read by said reading means arranged at critical control sites and are collated with the corresponding data stored in the updated contents of said control means.

With this arrangement, any abnormal states including fallen or missing test trays can be easily detected.

Preferably, said identification codes are bar codes and said reading means are bar code readers.

Alternatively, said identification codes are expressed by pin holes formed in said test trays and said reading means are photo-couplers.

Preferably, said data on the product ICs are the names, the lot numbers and the number of the product ICs.

Preferably, the operation of loading a succeeding lot is started before the completion of the operation of unloading a preceding lot.

The nature, principle and utility of the invention will become more apparent from the following detailed description when read in conjunction with the accompanying drawings.

BRIEF DESCRIPTION OF THE DRAWINGS

In the accompanying drawings:

FIG. 8 is a control table that can be used for the purpose of the invention;

FIG. 11 is a control table containing specific data; and

DESCRIPTION OF THE PREFERRED EMBODIMENTS

Now, the present invention will be described in greater detail by referring to the accompanying drawings that illustrate a preferred embodiment of the invention.

Figure 6:
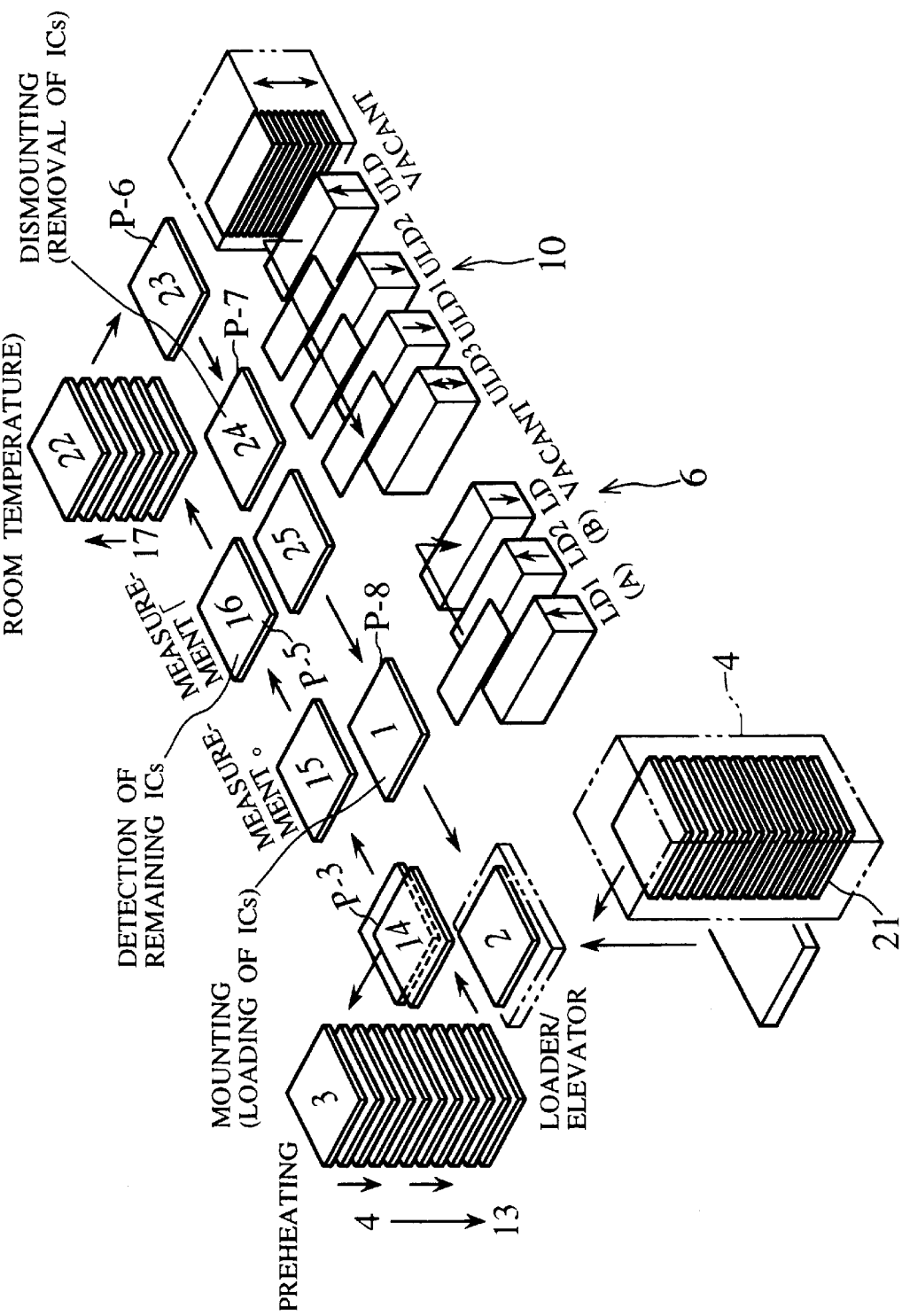
FIG. 6 is an illustration of the control sites of an embodiment of test handler for semiconductor devices according to the invention.

FIG.6 is an illustration of the control sites of the embodiment of test handler for semiconductor devices according to the invention.

Figure 1:
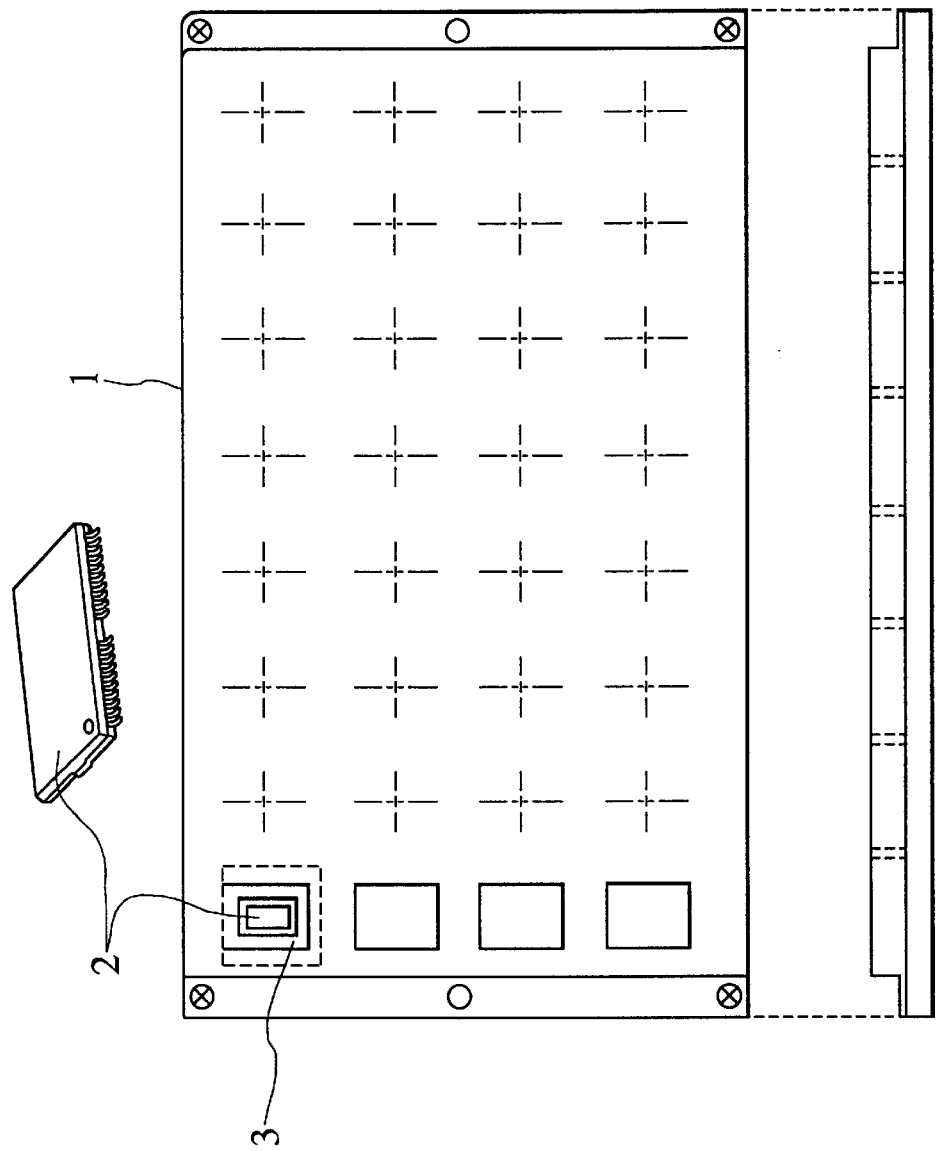
FIG. 1 is a schematic view of a test tray, showing its configuration.
Figure 2:
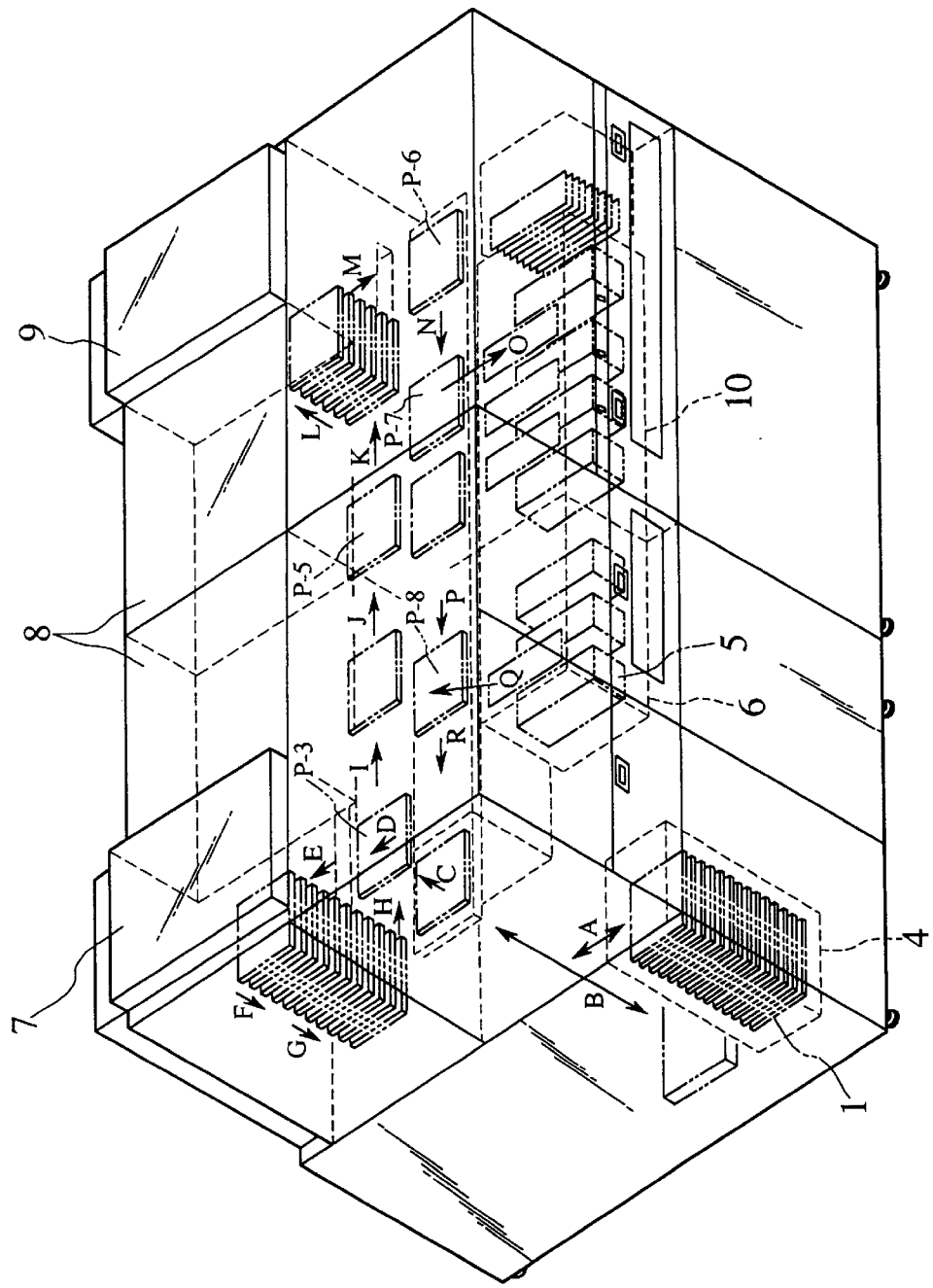
FIG. 2 is a schematic perspective view of a known test handler, showing its configuration.
Figure 3:
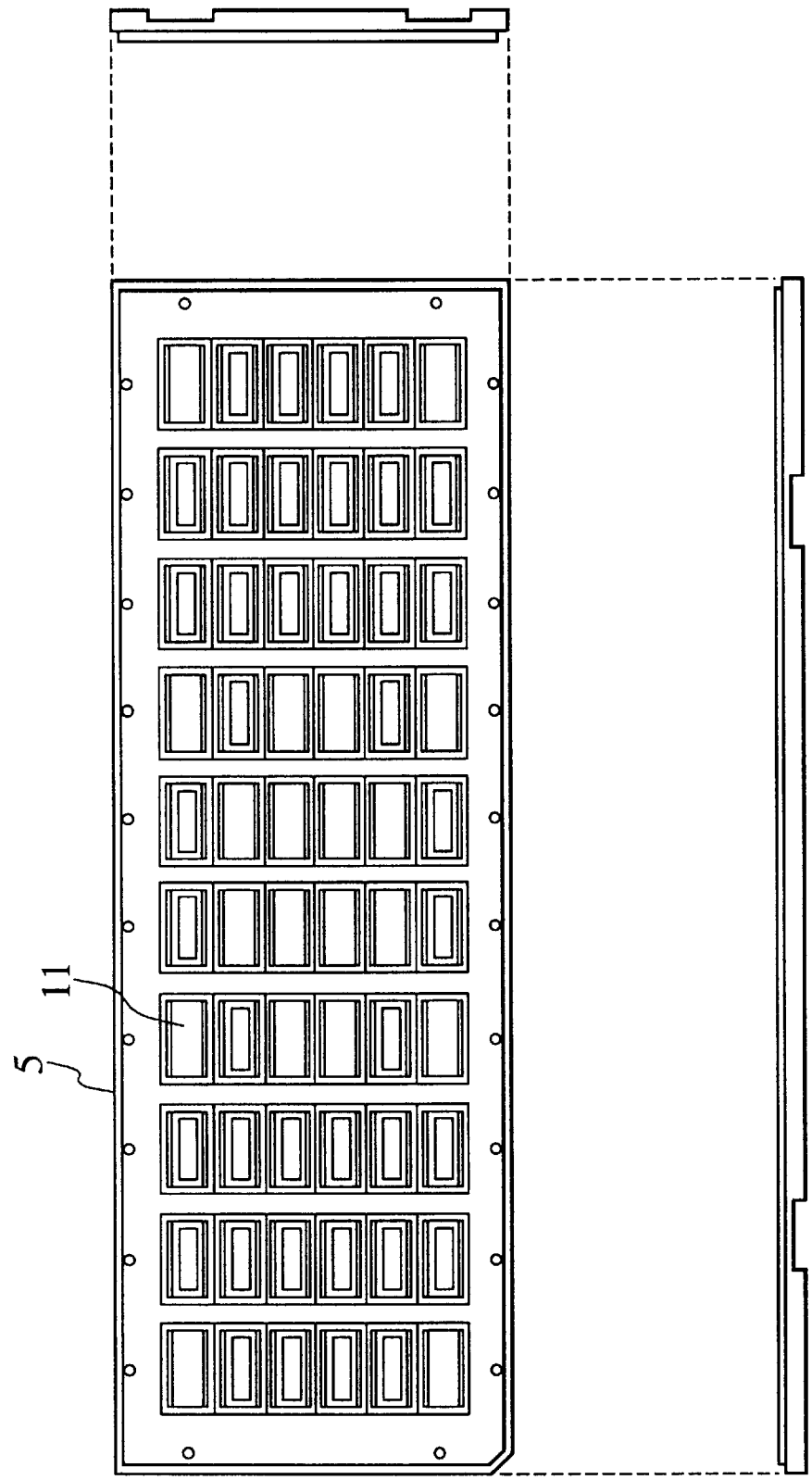
FIG. 3 is a schematic view of a product tray, showing its configuration.
Figure 4:
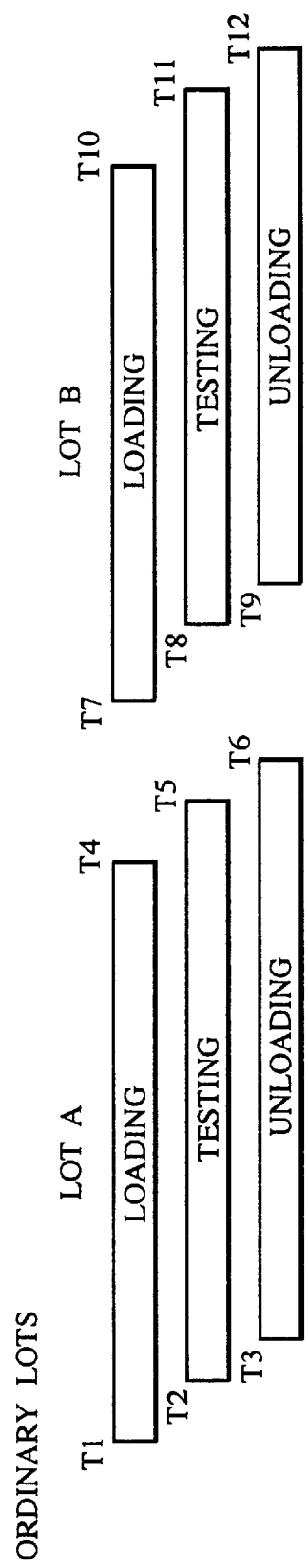
FIG. 4 is a chart of an operation sequence of a known test handler.
Figure 5A:
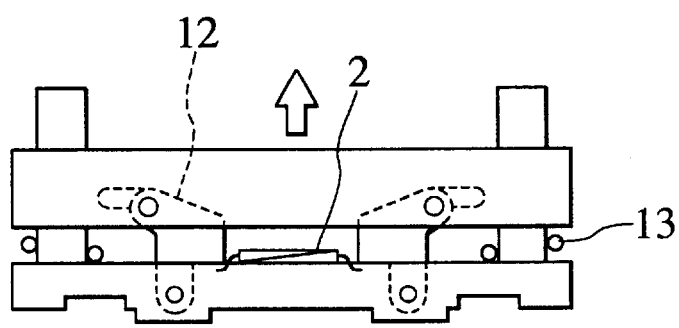
FIGS. 5A and 5B are schematic side views of a carrier used on a test tray.
Figure 5B:
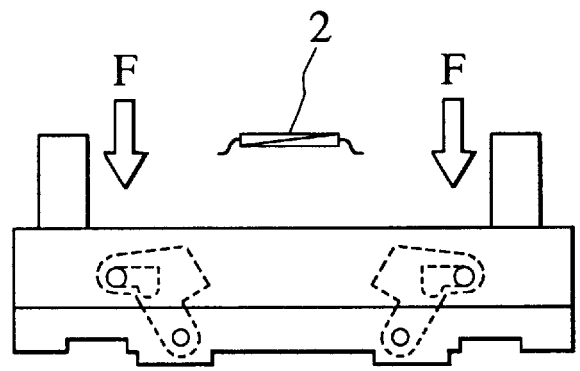
Figure 7:
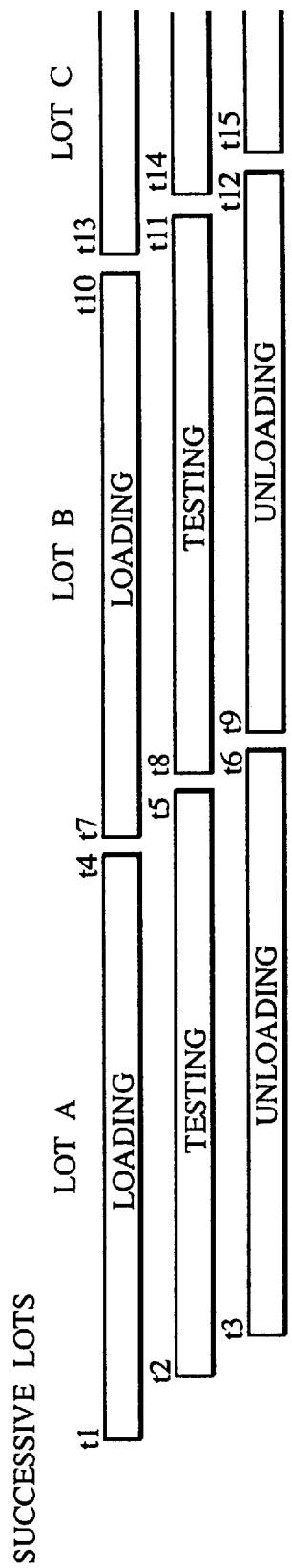
FIG. 7 is a chart of operation sequence of a testing equipment for continuous operation that can be used for the purpose of the invention.

As shown in FIG. 2, this embodiment of test handler for semiconductor devices operates with steps of loading a plurality of product ICs 2 to be tested on test trays by a loader section 6, transferring the test trays with the product ICs 2 to a testing section for testing the product ICs 2 and moving the test trays with the tested product ICs 2 to an unloader section 10 for sorting the product ICs 2 according to the test result and is characterized in that it comprises test trays 21 provided with respective identification codes specific to them to make them discriminable from any other test trays 21, reading means arranged respectively at given control sites on the test tray transfer route in the test handler for reading the identification codes of the test trays 21 passing there and a computer operating as control means and having a control table for storing and controlling the identification codes read by said reading means along with data on the control sites for reading the identification codes of test trays and the product ICs 2 loaded on the test trays 21 carrying the detected identification codes, including the names, the lot numbers and the number of the product ICs 2, said computer being adapted to display the contents of said control table on a monitor screen and centrally control the data on the individual test trays 21 obtained at the individual controlsites and those on the product ICs 2. This embodiment is driven to operate continuously according to the operation sequence illustrated in FIG. 7.

The name and the lot number of each product IC to be tested are stored in the computer, or the control means, before the start of the testing operation and the number of product ICs loaded on each test tray 21 is detected by the test handler when the product ICs 2 are loaded on the test tray 21 from one or more than one product trays 5. The detected number of product ICs is also stored in the computer along with their identification codes for cross reference.

The identification code of each test tray 21 may be a bar code that is applied to the test tray 21 and read by a bar code reader operating as reading means. Alternatively, the identification code may be expressed by pin holes formed in the test tray and detected by a photo-coupler. Still alternatively, the identification code may be expressed by projections formed on the test tray. In short, the identification code to be arranged on the test tray 21 may take any form appropriate for the test handler and the test tray 21 and any appropriate reading means may be used for detecting the identification code.

Referring to FIG. 6, there are arranged a total of 25 control sites where test trays 21 are held at rest for some time and to which control numbers 1 through 25 are assigned respectively. Each of the control sites are provided with a reading means for reading the identification code arranged on each test tray 21. Alternatively, only some critical control sites may be selected and provided with respective reading means.

Firstly, the identification code of each test tray 21 is read at the first control site or position P-8 located in the loader section 6 and stored in the control table having a format as schematically illustrated in FIG. 8. The current position (control site) and the P number, which is P-8, of the position where the test tray 21 is located, the name and the lot number of each product IC 2 carried by the test tray 21 and the number of product ICs on the test tray 21 are also registered on the control table.

The test tray 21 loaded with product ICs at position P-8 is then moved through control sites 2 through 25 and the identification code of the test tray 21 is detected at each of the control sites and collated with the identification code detected at control site 1. Thus, any abnormal states including fallen or missing test trays are automatically detected.

The product ICs 2 on the test tray 21 are removed from the tray at control site 24 and the data on the control table are erased at control site 25. The data on the control table are updated in synchronism with the movement of the test tray 21 within the test handler.

Now, for driving the testing equipment on a continuous basis, the test handler will be operated in a manner as described below by referring to FIG. 9.

Figure 9:
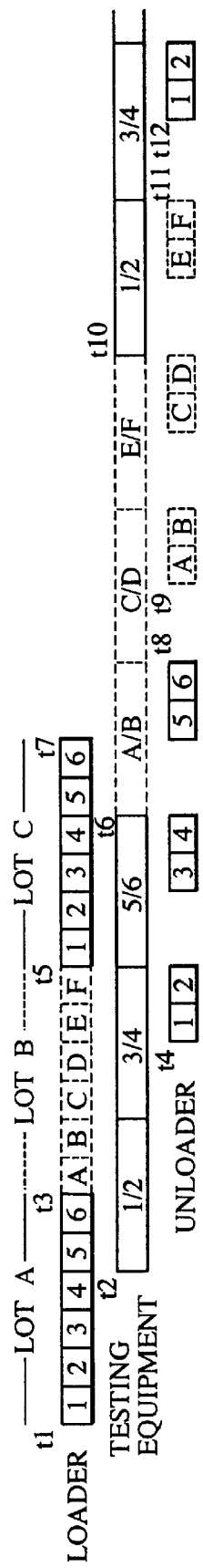
FIG. 9 is an exemplary chart of operation sequence that can be used for the purpose of the invention.

Referring to FIG. 9, assume that lots A, B and C are subjected to a continuous testing operation and the product ICs 2 of each lot are carried by 6 test trays. In FIG. 9, each square for loading and unloading operations represents the time expended in handling a single test tray 21, where as each square for testing operations represents the time expended for handling a pair of test trays 21 simultaneously.

According to the operation sequence of FIG. 9, the test handler starts loading for lots A, B and C at times t1, t3 and t5 and starts testing lots A, B and C at times t2, t6 and t10 respectively. It also starts unloading for lots A, B and C at times t4, t9 and t12.

At time t6, the test on lot A is completed and the test on lot B is started. At time t10, the test on lot B is completed and the test on lot C is started. The operation of unloading lot A is terminated at time t8 and that of unloading lot B is terminated at time t11. A closing handling operation (for sorting the product ICs, removing the product tray 5 from the unloader section and placing vacant product trays 5 in position for replacement) is conducted on lot A between time t8 and time t9 and on lot B between time t11 and time t12.

Figure 10:
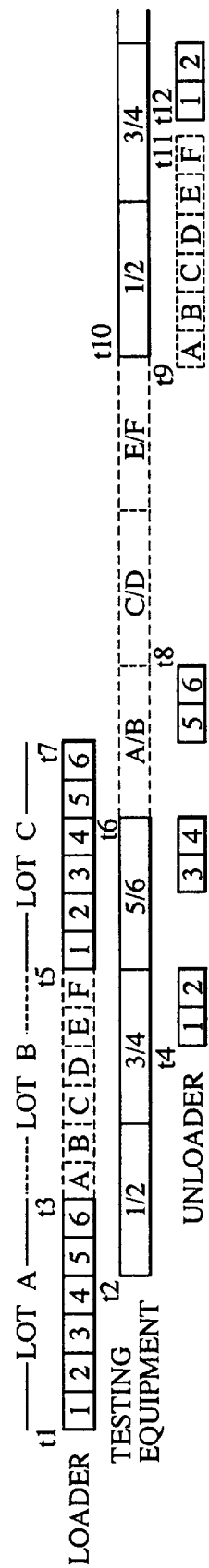
FIG. 10 is another exemplary chart of operation sequence that can also be used for the purpose of the invention.

FIG. 10 shows an operation sequence designed for a case where the closing handling operation is delayed from time t8. With the sequence of FIG. 10, the testing equipment is not formed to stop its operation if time t9 is shifted to come close to time 10.

FIG. 11 shows the identification codes of test trays 21 detected at the control sites at or near time t7 in FIG. 9.

The following facts can be found from the data registered on the control table of FIG. 11.

A total of 30 products XXYY of lot C are loaded on a test tray 21 with identification code TSOP50400-18 at position P-8 and transferred to the next control site. The product ICs of lot B on a test tray 21 with identification code TSOP50400-07 and those of lot B on a test tray 21 with identification code TSOP50400-09 are tested respectively at positions P-5 and P-3. The product ICs of lot A on a test tray 21 with identification code TSOP50400-05 are unloaded at position P-7.

In this way, the identification codes and the current positions of the test trays 21 in the test handler are centrally controlled with data on the product ICs carried by them so that the behavior of each of a plurality of lots can be observed in a discriminable manner to allow the test handler to carry on the operation of loading lots and driving the testing equipment on a continuous operation basis.

Now, a continuous operation of the embodiment and that of a known test handler will be compared by using numerical data obtained by calculations.

For the purpose of comparison, the following conditions are assumed.

Figure 12A:
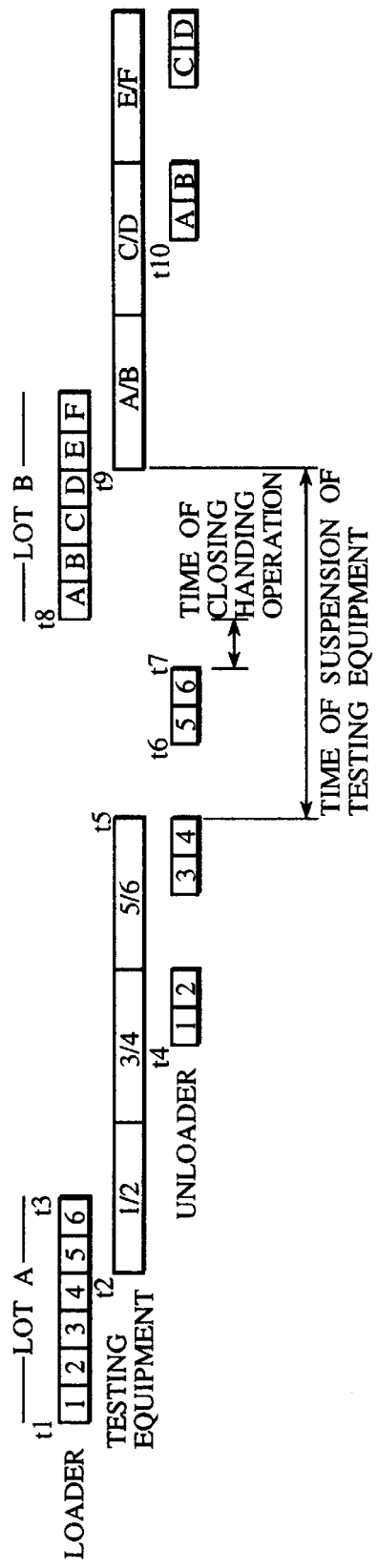
FIGS. 12a and 12B are charts of operation sequence that can be used respectively for a known test handler and an embodiment of the invention, respectively, showing the effectiveness of the latter.
Figure 12B:
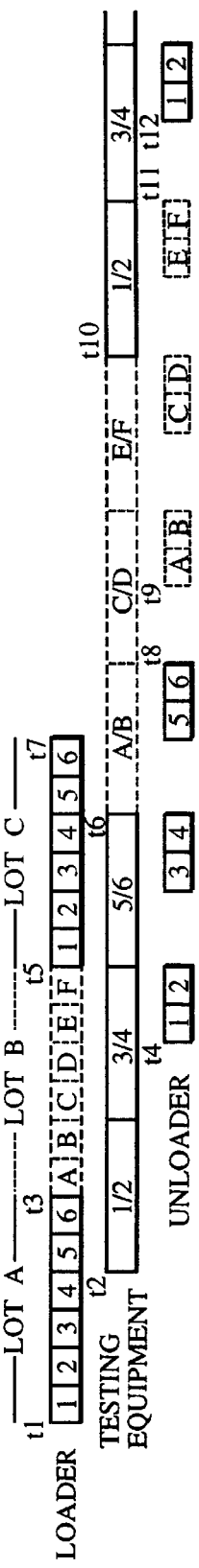

(1) time required for loading a test tray 21 with product ICs . . . . . 40 seconds/tray
(2) time required for moving a test tray 21 from the testing section to the unloader section 10 . . . . . 80 seconds
(3) time required for testing a pair of test trays 21 simultaneously . . . . . 160 seconds
(4) time required for transferring product ICs from a test tray 21 to a product tray 5 in the unloader section 10 . . . . . 40 seconds/tray
(5) time required for a closing handling operation (for sorting the product ICs, removing the product tray 5 from the unloader section and placing vacant product trays 5 in position for replacement) . . . . 80 seconds FIGS. 12a and 12B are charts of operation sequence used respectively for the known test handler and the embodiment of the invention under the above conditions when lots with a relatively small number of product ICs are handled.

As shown in FIG. 12A, with the operation sequence for the known test handler, lot A is handled between time t1 and time t7, whereas the handling operation of lot B is started at time t8. Thus, the operation of the testing equipment is suspended between time t5 and time t9 and resumed at time t9.

The testing equipment is driven for operation and held at rest for respective time periods as listed below.

operation = condition(3) × 3 = 160 × 3 = 480 seconds
suspension = condition(1) × 4 + condition(2) + condition(4) × 2 + condition(5)
= 40 × 4 + 80 + 40 × 2 + 80
= 160 + 80 + 80 + 80 = 400 seconds On the other hand, with the operation sequence for the embodiment shown in FIG. 12B, the suspension time is remarkably reduced. Table 1 below shows the time period of operation and that of suspension when lots A, B and C are handled continuously.

TABLE 1

| sequence | lot A operation | lot A suspension | lot B operation | lot B suspension | lot C operation | lot C suspension | total operation | total suspension | overall time period |
|---|---|---|---|---|---|---|---|---|---|
| known test handler | 480 | 400 | 480 | 400 | 480 | 400 | 1440 | 1200 | 2640 |
| embodiment | 480 | 160 | 480 | 0 | 480 | 200 | 1440 | 400 | 1840 |

As shown by the above calculations, the present invention provides the following advantages.

Firstly, the suspension time of the testing equipment is reduced to consequently reduce the overall handling time so that the handling capacity per unit time is remarkably improved. With the above calculations, the ratio of the overall handling time of the known handler to that of the embodiment is 1,840/2,640=0.697, which represents a reduction of time of about 30% in favor of the embodiment. If five lots are handled continuously, the corresponding ratio will be 2,800/4,400=0.636 or a reduction of time of about 36% in favor of the embodiment.

The operation of the above known test handler and that of the embodiment will be simulated for handling lots with a relatively large number of product ICs as commonly observed on the plant floor under the following conditions.
Conditions:
(1) number of product ICs of each lot . . . 960 (number of test trays . . . 30)
(2) operation time . . . 24 hours (86,400 seconds)
(3) loss of time in each loading operation . . . 160 seconds
(4) loss of time in each unloading operation . . . 240 seconds
known test handler (960 ICs/64 observations=15 times)
24 hours=[(test time×15)+160+240] ×X lots
X=30.8 lots
embodiment with continuous operation
24 hours=160+(test time)×15)×X lots+240
X=35.8 lots
capacity ratio=35.8/30.8=1.16

The embodiment represents an improvement of handling capacity of 16%.

On the other hand, condition (5) as defined above is normally undeterminable since the closing handling operation is mostly a manual operation performed by the operator. The time required for this operation varies depending on the behavior of the operator and is mostly increased from the expected value.

Thus, while the increase in the time for the closing handling operation is added to the overall handling time for the known test handler, its counterpart of the embodiment can be terminated within a predetermined time period (from time t8 to time t9 of FIG. 10) with the operation sequence of the embodiment so that the embodiment can be operated continuously without suspending the operation of the testing equipment to significantly increase the efficiency.

As described above in detail, since test trays are provided with respective specific identification codes, which are read and centrally controlled along with positional data on the test trays and data on the products carried by them, in a test handler according to the invention, the test trays can be located easily within the test handler to discriminate product ICs of different lots.

Thus, product ICs of different lots can be tested on a continuous basis to reduce the suspension time and improve the operation efficiency of the test handler in a continuous operation mode.

It should be understood that many modifications and adaptations of the invention will become apparent to those skilled in the art and it is intended to encompass such obvious modifications and changes in the scope of the claims appended hereto.

What is claimed is:

1. A test handler for semiconductor devices operating with steps of loading a plurality of product ICs to be tested on test trays in a loading section, transferring the test trays with the product ICs to a testing section for testing the product ICs and moving the test trays with the tested product ICs to a sorting section for sorting the product ICs according to the test result, the test handler comprising:

test trays provided with respective identification codes specific to them to make them discriminable from any other test trays;

reading means arranged respectively at given control sites on the test tray transfer route in the test handler for reading the identification codes of the test trays passing there; and control means including a control table for storing and controlling the identification codes read by said reading means along with data on the control sites for reading the identification codes of test trays and the product ICs loaded on the test trays carrying the detected identification codes and adapted to display the contents of said control table on a monitor screen, centrally control the data on the individual test trays obtained at the individual control sites and those on the product ICs and control to start the operation of loading a succeeding lot before the completion of the operation of unloading a preceding lot based on said control table in which the identification codes at the individual control sites are stored.

2. A test handler for semiconductor devices according to claim 1, wherein a reading means is arranged at the loading section of the test handler for reading the identification codes of the test trays located there to update the contents of said control table in synchronism with the operation of transferring said test trays.

3. A test handler for semiconductor devices according to claim 2, wherein the identification codes carried by the test trays in the test handler are read by said reading means arranged at critical control sites and are collated with the corresponding data stored in the updated contents of said control means.

4. A test handler for semiconductor devices according to claim 1, wherein said identification codes are bar codes and said reading means are bar code readers.

5. A test handler for semiconductor devices according to claim 1, wherein said identification codes are expressed by pin holes formed in said test trays and said reading means are photo-couplers.

6. A test handler for semiconductor devices according to claim 1, wherein said data on the product ICs are the names, the lot numbers and the number of the product ICs.

* * * * *